(12) United States Patent
Hochschild

(10) Patent No.: US 6,995,598 B2
(45) Date of Patent: Feb. 7, 2006

(54) LEVEL SHIFTER CIRCUIT INCLUDING A SET/RESET CIRCUIT

(75) Inventor: James R. Hochschild, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/384,138

(22) Filed: Mar. 7, 2003

(65) Prior Publication Data

US 2004/0160259 A1    Aug. 19, 2004

Related U.S. Application Data

(60) Provisional application No. 60/447,160, filed on Feb. 13, 2003.

(51) Int. Cl.
*H03L 5/00*    (2006.01)
(52) U.S. Cl. .......................... 327/333; 326/81
(58) Field of Classification Search ................ 327/333, 327/52–57; 326/62–83
See application file for complete search history.

(56) References Cited

U.S. PATENT DOCUMENTS

| | | | |
|---|---|---|---|
| 5,113,097 A | 5/1992 | Lee | |
| 5,157,281 A | 10/1992 | Santin et al. | |
| 5,173,624 A | 12/1992 | Gabillard et al. | |
| 5,272,389 A | 12/1993 | Hatada | |
| 5,289,057 A | 2/1994 | Kinugasa | |
| 5,341,047 A | 8/1994 | Rosenthal | |
| 5,351,182 A | 9/1994 | Miyazaki et al. | |
| 5,396,108 A * | 3/1995 | McClure | 327/108 |
| 5,450,357 A | 9/1995 | Coffman | |
| 5,493,245 A | 2/1996 | Kao et al. | |
| 5,502,406 A | 3/1996 | Traynor et al. | |
| 5,659,258 A | 8/1997 | Tanabe et al. | |
| 5,696,728 A | 12/1997 | Yu et al. | |
| 5,764,094 A | 6/1998 | Hatsuda | |
| 5,818,278 A | 10/1998 | Yamamoto et al. | |
| 5,912,577 A | 6/1999 | Takagi | |
| 5,933,043 A | 8/1999 | Utsunomiya et al. | |
| 6,034,549 A | 3/2000 | Matsumoto et al. | |
| 6,043,699 A | 3/2000 | Shimizu | |
| 6,160,735 A | 12/2000 | Hirano | |
| 6,208,200 B1 | 3/2001 | Arakawa | |
| 6,222,384 B1 | 4/2001 | Kim | |
| 6,222,385 B1 | 4/2001 | Kang | |
| 6,255,888 B1 | 7/2001 | Satomi | |

(Continued)

*Primary Examiner*—Kenneth B. Wells
(74) *Attorney, Agent, or Firm*—W. Daniel Swayze, Jr.; W. James Brady; Frederick J. Telecky, Jr.

(57) ABSTRACT

The present invention discloses a level shifter circuit (20) comprising a serially coupled first device (M3) and second device (M5), a serially coupled third device (M4) and fourth device (M6), a parallel coupled first pull-up device (M9) and second pull-up device (M10), a plurality of nodes (N1–N4), and a set-reset latch (22) comprising a first gate (I1) and a second gate (I2), wherein the first device (M3) is coupled to the first pull-up device (M9) via a first one (N1) of the plurality of nodes, wherein the second device (M5) is coupled to the first gate (I1) via a third one (N3) of the plurality of nodes, wherein the third device (M4) is coupled to the second pull-up device (M10) via a second one (N2) of the plurality of nodes, and wherein the fourth device (M6) is coupled to the second gate (I2) via a fourth one (N4) of the plurality of nodes.

27 Claims, 1 Drawing Sheet

U.S. PATENT DOCUMENTS

| | | |
|---|---|---|
| 6,259,299 B1 | 7/2001 | Ryu |
| 6,292,031 B1 | 9/2001 | Thompson et al. |
| 6,304,105 B1 | 10/2001 | Fujiyoshi |
| 6,326,831 B1 | 12/2001 | Kumagai |
| 6,359,493 B2 | 3/2002 | Satomi |
| 6,373,285 B1 | 4/2002 | Konishi |
| 6,414,529 B1 * | 7/2002 | Hirairi ........................ 327/218 |
| 6,433,582 B2 | 8/2002 | Hirano |
| 6,445,622 B1 | 9/2002 | Hirano |
| 6,476,645 B1 * | 11/2002 | Barnes ......................... 327/51 |
| 6,483,345 B1 | 11/2002 | Whittaker et al. |
| 6,501,321 B2 | 12/2002 | Kumagai |
| 6,777,981 B2 * | 8/2004 | Kobayashi ................... 326/81 |
| 6,828,825 B2 * | 12/2004 | Johnson et al. ............... 326/68 |

\* cited by examiner

LEVEL SHIFTER CIRCUIT INCLUDING A SET/RESET CIRCUIT

CROSS REFERENCE TO RELATED APPLICATIONS

This application is related to U.S. Provisional patent application Ser. No. 60/447,160 and Ser. No. 10/453,426, entitled Variable Adaptive Quantization In Sigma-Delta Modulators, filed Feb. 13, 2003, and U.S. Patent applications Ser. No. 10/383,962 entitled H-Bridge Common-Mode Noise Reduction Circuit, and Ser. No. 10/384,262 entitled Circuit For Modifying A Clock Signal To Achieve A Predetermined Duty Cycle, each filed herewith, the teachings of each application incorporated herein by reference.

FIELD OF THE INVENTION

The present invention relates to level shifter circuits and, more particularly, to a level shifter circuit with faster, better matched, rise and fall times and delays.

BACKGROUND OF THE INVENTION

Various devices use voltages that are different from an input signal voltage. In such devices, the input signal voltage must be shifted to a high voltage or to a low voltage. A circuit that performs such shifting is known as a level shifter circuit.

FIG. 1 depicts a prior art level shifter circuit 10 comprising an input D adapted to receive a digital signal that is either at the level of an input power supply AVBB or an input ground AVSS. Assuming the input was AVSS (which would be logic low) then transistor M7 would be turned on. The P-channel devices, M6 and M8, are much weaker than the N-channel devices M5 and M7 so even if device M8 were initially on, when device M7 is turned on, it is strong enough to pull the output Q low thus overpowering device M8. As soon as the output Q goes low, device M5 is turned off because the input D is at a logical low level and device M6 is turned on which then pulls output QZ (inverse Q) high. There is no conflict at the output QZ because only device M6 is on. Therefore, the output is flipped such that Q is low and QZ is high. When the input D goes high, transistor M5 turns on and a fight between transistors M5 and M6 occurs because the output Q is, at this point, still low (transistor M6 is still turned on). Since the N-channel devices are stronger than the P-channel devices, M5 wins the fight between M6, the QZ output is pulled low, and device M8 is turned on which pulls the output Q high because at this point, device M7 is turned off.

One of the problems associated with the prior art level shifter circuit 10 is that because the P-channel devices have to be weak by design in order for the N-channel devices to be able to overpower them, when an output makes a transition from low to high, it is a slow transition because of a weak P-channel device above pulling it up. Conversely, when an output makes a transition from high to low, a strong N-channel device on the bottom is pulling it down. As such, a much faster high to low transition exists than a low to high transition which, in the case of a switching signal, is undesirable.

To overcome such a problem, the P-channel devices can be made stronger. However, the N-channel devices would then have to be made even stronger to ensure they win the fight between the P-channel devices and the circuit operates properly. Limitations exist, however, in that more power is used because even though a short period of time may elapse when an N-channel device and a P-channel device are fighting each other, current is shooting straight through from the input power supply to the ground until finally the other side flips and turns the P-channel device off. In order to save power, the devices can be made as weak as possible so that the shoot through current is minimized, however the speed of the circuit 10 would be comprised. The disparity between the output rise time and fall time would still exist so the propagation time between, for example, an input rising edge to an output rising edge would be relatively slow because of a weak P-channel device pulling the output high. In contrast, the delay time between an input falling edge to an output falling edge would be relatively fast because a strong N-channel device exists which pulls the output Q low. Such slow rise times and poorly matched rise and fall times are undesirable. For example, in a clocking signal, a 50% duty cycle clock waveform may exist but after the waveform passes through the circuit 10, excessive delay due to the slow nature of the circuit would exist. However, because the rising edge and the falling edge are delayed by a different amount, the 50% duty cycle clock waveform will be degraded.

Additional buffering may be used to overcome such limitations but, poor rise and fall time matching may still exist. The rise and fall times can be improved by adding inverter buffers to the output Q. This could improve the rise and fall time of the final signal but the delay is not improved because such a delay is present at the output Q. Adding additional buffering will not undo this delay once it is present at the output Q and may increase the cost and complexity of the circuit. Introducing delay is typically not recommended.

It is therefore desirable for the present invention to overcome the problems and limitations described above that are involved in a level shifter circuit.

SUMMARY OF THE INVENTION

The present invention achieves technical advantages as a level shifter circuit that allows faster operation with better matching of rise and fall times and delays.

In one embodiment, a level shifter circuit comprises a serially coupled first device and second device, a serially coupled third device and fourth device, a parallel coupled first pull-up device and second pull-up device, a plurality of nodes, and a set-reset latch comprising a first gate and a second gate, wherein the first device is coupled to the first pull-up device via a first one of the plurality of nodes, wherein the second device is coupled to the first gate via a third one of the plurality of nodes, wherein the third device is coupled to the second pull-up device via a second one of the plurality of nodes, and wherein the fourth device is coupled to the second gate via a fourth one of the plurality of nodes.

In another embodiment, a level shifter circuit comprises a complementary logic input adapted to receive a digital signal, a first pull-up transistor, a first node, and a first voltage, wherein the first pull-up device is coupled to the first node and to the first voltage. The circuit further comprises a second pull-up transistor and a second node, wherein the second pull-up device is coupled to the second node and to the first voltage, and wherein the first node and the second node are adapted to receive the digital signal. The circuit also includes a set-reset latch, a third node, a fourth node, a first transistor coupled to the complementary logic input and to the first node, a second transistor coupled to the first transistor and to the third node, a third transistor coupled to the second node and to the complementary logic input, and a fourth transistor coupled to the third transistor, wherein the first node and the second node are adapted to provide inputs to the set-reset latch, and wherein the third node and the fourth node are adapted to provide outputs from the set-reset latch. A logic output adapted to output the digital signal is also included, wherein the output terminal is adapted to receive the digital signal from the fourth node.

In a further embodiment, a level shifter circuit comprises a serially coupled first device and second device, a serially coupled third device and fourth device, a parallel coupled fifth device and sixth device, and a set-reset latch, wherein the first device is coupled to the fifth device, thereby forming a first coupling, wherein the second device is coupled to the set-reset latch, wherein the fourth device is coupled to the set-reset latch, wherein the third device is coupled to the sixth device, thereby forming a second coupling, and wherein one of the first coupling and the second coupling pulses at a time while another one of the first coupling and the second coupling remains high.

In yet another embodiment, a level shifter circuit comprises a serially coupled first device and second device, a serially coupled third device and fourth device, a parallel coupled fifth device and sixth device, and a set-reset latch, wherein the first device is coupled to the fifth device, wherein the second device is coupled to the set-reset latch, wherein the third device is coupled to the sixth device, and wherein current is drawn through the circuit when a low level occurs at such a coupling and there is a fight between the sixth pull-up device and the serially coupled third device and fourth device, and wherein the fourth device is coupled to the set-reset latch.

DETAILED DESCRIPTION OF THE INVENTION

Figure 1:
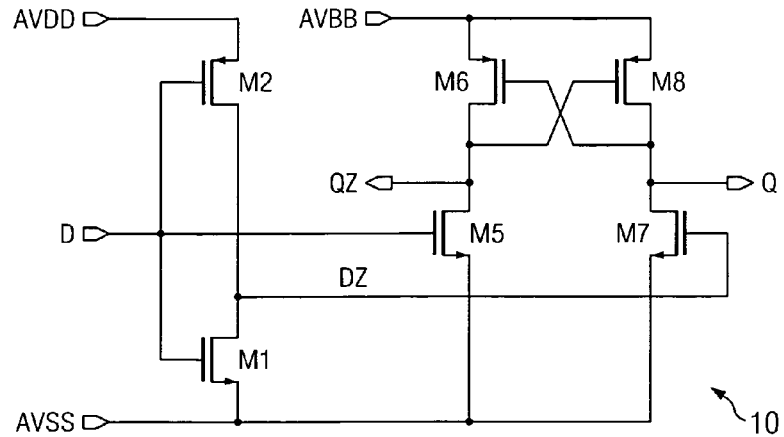
FIG. 1 illustrates a prior art level shifter circuit.
Figure 2:
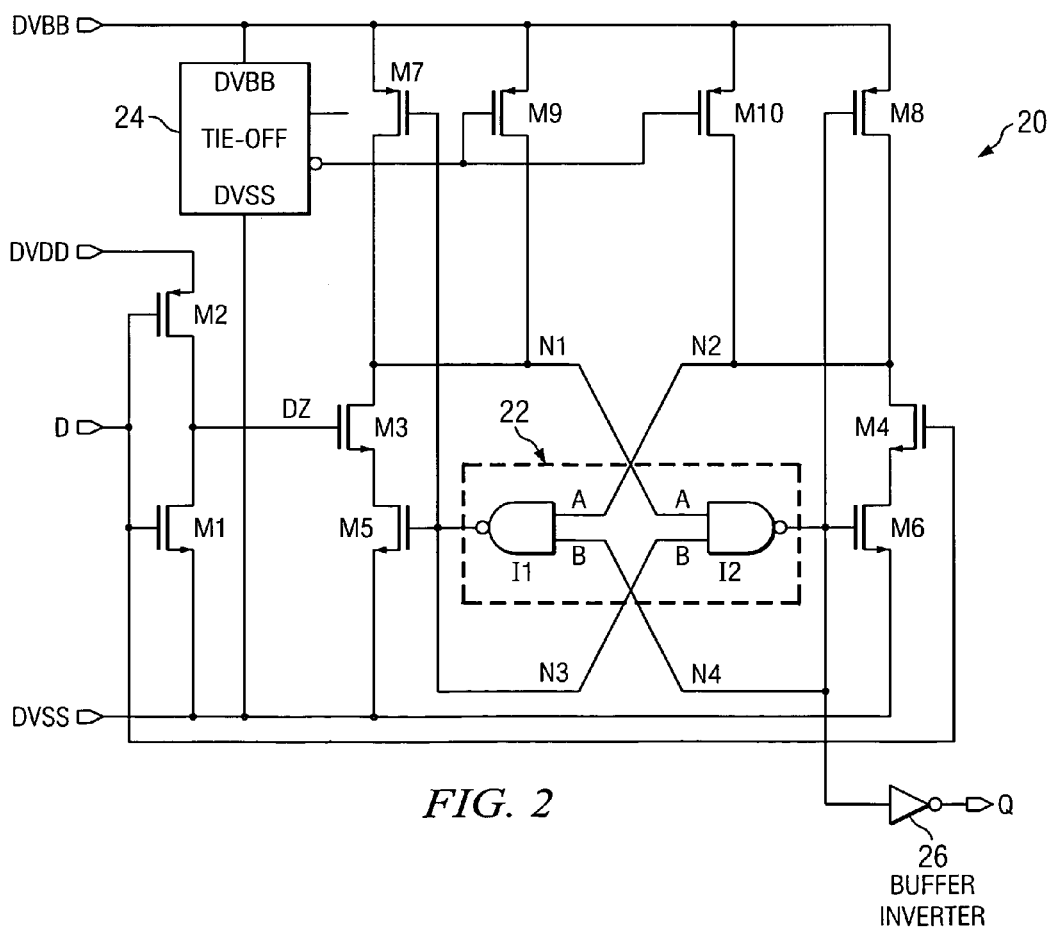
FIG. 2 illustrates a level shifter circuit in accordance with an exemplary embodiment of the present invention.

Referring now to FIG. 2, a level shifter circuit 20 of the present invention is presented. In one embodiment, the level shifter circuit 20 comprises a serially coupled first device M3 and second device M5, a serially coupled third device M4 and fourth device M6, a parallel coupled first pull-up device M9 and second pull-up device M10, a plurality of nodes N1-N4, and a set-reset latch 22 comprising a first gate I1 and a second gate I2, wherein the first device M3 is coupled to the first pull-up device M9 via a first one N1 of the plurality of nodes, wherein the second device M5 is coupled to the first gate I1 via a third one N3 of the plurality of nodes, wherein the third device M4 is coupled to the second pull-up device M10 via a second one N2 of the plurality of nodes, and wherein the fourth device M6 is coupled to the second gate I2 via a fourth one N4 of the plurality of nodes.

The level shifter circuit 20 further comprises a complementary logic input D and DZ coupled to the first device M3 and to the third device M4, a first speed-up device M7 coupled to the first node N1 and to the third node N3, a second speed-up device M8 coupled to the second node N2 and to the fourth node N4, a first input voltage DVBB coupled to the first pull-up device M9, to the second pull-up device M10, to the first speed-up device M7, and to the second speed-up device M8, a second input voltage DVDD coupled to the complementary logic input, and a third input voltage DVSS coupled to the second device M5 and to the fourth device M6.

The second node N2 and the fourth node N4 of the circuit 20 are inputs of the first gate I1, the first node N1 and the third node N3 are inputs of the second gate I2, the third node N3 is an output of the first gate I1, and the fourth node N4 is an output of the second gate I2. A buffer inverter 26 is also included which is coupled to the fourth node N4 and to an output terminal Q.

As in the prior art level shifter circuit 10, a fight between weak P-channel devices (M9 and M10) and strong N-channel devices (M3–M6) still occurs in the present level shifter circuit 20. Also, as in the prior art level shifter circuit 10, the falling edge of the output Q is fast because a strong N-channel device is controlling the timing. In the present level shifter circuit 20, a falling edge on either one of the nodes N1 and N2 is also fast as a result of either a rising or falling edge on the input D. A rising edge on the input D would cause a rising edge on the output Q or vice versa but a fast event still occurs. If the circuit 20 only used the falling edge to propagate the data through to the output Q and ignored the rising edge or the recovery of the nodes N1 and N2 back up to the output power supply voltage level DVBB, then the slow rising edge would not be relied upon.

If, for example, the input D is initially low, then node DZ is high, device M3 is on and device M4 is off. If device M5 is on, that will pull node N1 down and it will flip the set-reset latch 22, which may be, for example, a NAND latch, thus forcing node N4 to go high. When N4 goes high, device M6 is switched on, and node N3 goes low which switches device M5 off. In a static condition, device M3 will be on and device M5 will be off, and device M4 will be off and device M6 will be on. As such, both of the N-channel series connected legs (devices M3 and M5, and devices M4 and M6) are essentially off thereby not drawing any static supply current thus leaving the output Q low.

When the input D transitions to a high state, node DZ transitions to a zero. However, since the set-reset latch 22 has not flipped yet, nodes N1 and N2 are both high. As such, devices M4 and M6 are both on but due to the fact that a weak pull-up device M10 is a much weaker device than the series combination of devices M4 and M6, node N2 will pull low. When node N2 pulls low, the output N3 of the left gate I1 of the set-reset latch 22 goes high so node N3 makes a transition from a zero to a one and its complementary output, node N4, makes a transition from a one to a zero. It should be noted that when either input of the set-reset latch 22 is low the output is high. Device M6 now turns off and device M4 is still on because the input D is still high. Since device M6 has turned off, node N2 pulls high again.

The recovery time for node N2 is relatively fast because of speed-up devices M7 and M8. If these devices M7 and M8 were not present, the circuit 20 would still function but the recovery time for node N2 would be relatively slow since the pull-up device M10 is a weak device. In order to speed the recovery time (to prepare for the next transition on the input D) devices M7 and M8 are present. When node N4 makes the transition from a one to a zero, device M8 is turned on and device M6 is turned off. Device M8 is not a very weak device such as device M10 which allows node N2 to be pulled high faster than if M8 were not present. Devices M7 and M8 are included in the circuit for increasing the speed of change on the input edge to prepare the circuit 20 for that change. These devices M7 and M8 do not have to be present if such a speed of change were not needed.

Node N1 remained high as the input D transitioned from low to high, because either device M3 was on and device M5 was off or device M3 was off and device M5 was on. Node N2, which had a negative or low going pulse, transitioned from a one to a zero and back to a one again. The duration of the low going pulse on node N2 is only long enough to cause the set-reset latch 22 to flip. The only time that current was drawn through the cell was the period of time when node N2 was low and there was a fight between the weak pull-up device M10 and the series combination of devices M4 and M6. Pull-up devices M9 and M10 are always on and the controlling gate node is low (which for P-channel device means they are always turned on). These devices M9 and M10 could be transistors, resistors, or any kind of weak pull-up device that is always on.

The gates of the devices M9 and M10 are shown connected to a tie-off circuit 24 (which asserts a logic level zero) but can also be connected to the ground voltage DVSS. Utilizing the tie-off circuit 24, as opposed to tying a controlling input of the devices M9 and M10 directly to a power supply, is advantageous in terms of the reliability of the circuit 20 when dealing with electrostatic discharge events. If the gates of the devices were connected to DVSS, the circuit 20 would function similarly as with a connection to the tie-off circuit 24 but may be more susceptible to damage because of an electrostatic discharge event.

A buffer inverter 26 provides better drive capability at the output Q for driving the next circuit (not shown) that the output is feeding. A less desirable solution would be to make the P-channel and N-channel devices of the set-reset latch 22 much bigger. This, however, would increase the total amount of device area thereby loading down the inputs A and B of the set-rest latch 22 and affecting the propagation time through the entire circuit 20. A buffer inverter could have been implemented in the prior art circuit 10 but that would not solve the problem of having unequal rise delay times and fall delay times. The problem of more nearly equalizing the rise time and the fall time of the output signal could be somewhat solved but the propagation time for the rising delay time against the falling delay time of the circuit 10 would still be skewed.

The buffer inverter 26 is useful because when counting the number of gate delays from the input D to the output Q for a rising edge versus a falling edge, different paths may be utilized but the number of gate delays is the same. As such, a better chance of sizing the devices to equalize or match the rising delay versus the falling delay is reached. The key to timing improvement in the circuit 20 is the fact that it is relying only on the fast falling edges (and not the rising edges) of the internal fighting nodes N1 and N2 in order to propagate data. Since the rising edges are used for recovery, very weak P-channel pull-up devices can be used thereby saving power.

In summary, a rising edge on the input D causes a falling edge on node N2 which sets the left set-reset latch gate I1, causing the output Q to go high. Once I1 is set, device M6 turns off allowing node N2 to recover to DVBB. Device M8 also turns on allowing faster recovery in preparation for the next input transition. Conversely, a falling edge on the input D causes a falling edge on node N1 which re-sets the right set-reset latch gate I2, causing the output Q to go low. Once I2 is re-set, device M5 turns off allowing node N1 to recover to DVBB. Device M7 also turns on allowing faster recovery in preparation for the next input transition. Since the signal propagation does not depend on the rising edge of N1 or N2, delay is reduced, speed is increased and the rise and fall times and delays may be better matched. Also, devices M7 and M8 allow higher speed without the need for making devices M9 and M10 stronger, thereby saving power.

The rising edges of nodes N1 and N2 are slow edges because of the weak pull-up devices M9 and M10. The speed-up devices M7 and M8 can improve such slow edges. One of the biggest limitations of the prior art level shifter circuit 10 is the fact that the rising edge on the outputs Q and QZ is a very slow transition. Since the level shifter circuit 20 of the present invention does not rely on the rising edge of either nodes N1 or N2 to propagate the data through the cell means that relying on the slow rise time of either of these nodes, as is the case with the circuit 10, has been eliminated. The rise time, which is slow because devices M9 and M10 are weak, is slower than the fall times of nodes N1 and N2. This is true because relatively strong N-channel devices are pulling nodes N1 or N2 down but the relatively weak P-channel devices are pulling nodes N1 or N2 back up again. The high to low transition is the fast transition on either N1 or N2 which is the transition that results in the propagation of the data through the cell 20. Thus, better matching of rise and fall times and delays occurs.

The latch gate devices are preferably not identically the same size in an attempt to equalize the delay path through the cell 20 for the rising edge versus the falling edge of data. The time it takes for nodes N1 or N2 to recover does not affect the amount of time it takes for the data to propagate through the cell 20 but, as previously described, does affect the amount of time it takes for the cell to be ready for the next transition on the input D. So, if the input transition does not occur very frequently, devices M7 and M8 could be eliminated because nodes N1 and N2 would have ample time to recover. However, if a rapidly changing input such as a clock signal were present, and the cell 20 had to recover in time for the next edge, then the speed-up devices M7 and M8 can aid in such a recovery. If devices M7 and M8 were not present, devices M9 and M10 would have to provide the rise recovery time or the low to high transition on nodes N1 or N2. This can take some time because the P-channels are weak. But, if the speed up devices M7 and M8 were present, then node N1 or N2 (determined by which node pulsed low) would recover back high again in an expedited manner thereby readying the next transition on the input D that much sooner.

The fight between the strong N-channels and the weak P-channels permits the level shifter circuit 20 to pull half the current as compared to the level shifter circuit 10 because the P-channels are approximately half the strength. Since the circuit 20 only relies on the fast falling edges of nodes N1 and N2 to propagate the signal, it is a faster circuit with better matching between the propagation times of rising and falling edges. Therefore, as the clock signal propagates through the buffer inverter 26, it will have a more nearly 50% duty cycle on the output Q assuming it was initially 50% (or approximately 50%) on the input D. The output Q would comprise a nearly 50% duty cycle (unlike the circuit 10), which is very important when exporting a clock to be used by another system. For example, the other system could be a digital signal processor (DSP) external of the circuit 20 and the DSP could be sensitive to the duty cycle. Therefore, the DSP would need the approximately 50% duty cycle from the circuit 20. Attempting to propagate a 50% clock from the prior art circuit 10 to the DSP could have corrupted this relationship and may not have been acceptable. The circuit 20, however, which allows well matched rise and fall delay times, does not have this problem. There are situations when well matched rise and fall delay times are not an issue. For example, if static control signals are being used, the circuit 10 should function properly because timing is not critical. But, in situations where timing is critical and a switching (dynamic) signal is used, the circuit 20 should be used.

To set or reset the latch 22, one of the inputs A and B is pulled low. When both inputs A and B are high, then the latch 22 is in a memory state. Pulling the input from high to low either sets or resets the latch depending on which input is being pulled low because in the level shifter circuit 20, it is the high to low transition that is the fast desirable transition. Thus, utilizing that transition to set the latch is a key feature. After the transition, the circuit is static and is not drawing any power. In the static state, nodes N1 and N2 are sitting high therefore no power is being drawn through the pull-up devices M9 and M10 that are always on. With the cell 20 in a static state, it is waiting for the next edge. As long as the input level is being held, be it high or low, the output will remain at a high or low level.

When a transition on the input D appears, various nodes flip and a pulse appears on either node N1 or N2. At the end of the process, however, nodes N1 and N2 return to their original state where both inputs are still high (in the prior art circuit 10, two complimentary outputs flip and then stay flipped). But the node that pulsed low, for example N2, does not go back high again until after it flipped the latch. Thus, it is guaranteed that N2 will stay low long enough to flip the latch, because node N2 does not go back high again until after the latch is flipped. In a sense, this is similar to a hand-shaking arrangement where the pulse goes low, which flips the latch, which allows the pulse to go back high again. So the pulse, by definition or by design, will be just wide enough to flip the latch thereby preventing a race type condition.

The input voltage DVDD is preferably around 1.1 V to around 1.5 V and input voltage of DVBB is preferably around 1.1 V to around 3.6 V. It is further preferred that DVBB is greater than DVDD and that the input D receives a voltage from a low voltage operating circuit (not shown) and that the output Q outputs a voltage to a higher voltage operating circuit (not shown). If the low voltage operating circuit was running, for example, at 1.3 V, but there was a need to have I/O signals of the low voltage operating circuit reach the higher voltage operating circuit running, for example, at 3.0 V, in order to be compatible with the higher voltage operating circuit, the I/O signals that go between the two circuits have to be operating at the higher 3.0 V. Otherwise, the higher voltage operating circuit will not correctly interpret the signals that it is receiving from the low voltage operating circuit via the level shifter circuit 20. Power efficiency in the core of a system comprising the circuits can be realized by operating at the lower voltage but if an application requires a higher voltage, the I/O power supply can be set to the larger supply level and thus will be able to communicate with other circuits or chips that are operating at that higher supply.

In another embodiment of the present invention, the level shifter circuit 20 comprises a serially coupled first device M3 and second device M5, a serially coupled third device M4 and fourth device M6, a parallel coupled fifth device M9 and sixth device M10, and a set-reset latch 22, wherein the first device is coupled to the fifth device, thereby forming a first coupling, wherein the second device is coupled to the set-reset latch, wherein the fourth device is coupled to the set-reset latch, wherein the third device is coupled to the sixth device, thereby forming a second coupling, and wherein one of the first coupling and the second coupling pulses at a time while another one of the first coupling and the second coupling remains high.

Although an exemplary embodiment of the present invention has been illustrated in the accompanied drawings and described in the foregoing detailed description, it will be understood that the invention is not limited to the embodiments disclosed, but is capable of numerous rearrangements, modifications, and substitutions without departing from the spirit of the invention as set forth and defined by the following claims.

What is claimed is:

1. A level shifter circuit, comprising:
   a serially coupled first device and second device;
   a serially coupled third device and fourth device;
   a coupled first pull-up device and second pull-up device;
   a plurality of nodes; and
   a set-reset latch comprising a first gate and a second gate;
   wherein the first device is coupled to the first pull-up device by a first one of the plurality of nodes;
   wherein the second device is coupled to the first gate by a third one of the plurality of nodes;
   wherein the third device is coupled to the second pull-up device by a second one of the plurality of nodes;
   wherein the fourth device is coupled to the second gate by a fourth one of the plurality of nodes; and
   a first speed-up device coupled to the first node and to the third node.

2. The level shifter circuit of claim 1, wherein a complementary logic input signal is coupled to the first device and the third device.

3. The level shifter circuit of claim 1 further comprising a second speed-up device coupled to the second node and to the fourth node.

4. The level shifter circuit of claim 1 further wherein a first input voltage is coupled to the first pull-up device and to the second pull-up device.

5. The level shifter circuit of claim 1 further wherein a first input voltage is coupled to the first speed-up device.

6. The level shifter circuit of claim 3 further wherein a first input voltage is coupled to the second speed-up device.

7. The level shifter circuit of claim 4 further wherein a second input voltage is coupled to the complementary logic input.

8. The level shifter circuit of claim 7 further wherein a third input voltage is coupled to the second device and to the fourth device.

9. The level shifter circuit of claim 1 further comprising a buffer inverter coupled to the fourth node.

10. The level shifter circuit of claim 9 further comprising an output terminal coupled to the buffer inverter.

11. A level shifter circuit, comprising:
    a serially coupled first device and second device;
    a serially coupled third device and fourth device;
    a coupled first pull-up device and second pull-up device;
    a plurality of nodes; and
    a set-reset latch comprising a first gate and a second gate;
    wherein the first device is coupled to the first pull-up device by a first one of the plurality of nodes;
    wherein the second device is coupled to the first gate by a third one of the plurality of nodes;
    wherein the third device is coupled to the second pull-up device by a second one of the plurality of nodes;
    wherein the fourth device is coupled to the second gate by a fourth one of the plurality of nodes; and
    wherein the second node and the fourth node are inputs of the first gate.

12. A level shifter circuit, comprising:
    a serially coupled first device and second device;
    a serially coupled third device and fourth device;

a coupled first pull-up device and second pull-up device;
a plurality of nodes; and
a set-reset latch comprising a first gate and a second gate;
wherein the first device is coupled to the first pull-up device by a first one of the plurality of nodes;
wherein the second device is coupled to the first gate by a third one of the plurality of nodes;
wherein the third device is coupled to the second pull-up device by a second one of the plurality of nodes;
wherein the fourth device is coupled to the second gate by a fourth one of the plurality of nodes; and
wherein the first node and the third node are inputs of the second gate.

13. A level shifter circuit, comprising:
a serially coupled first device and second device;
a serially coupled third device and fourth device;
a coupled first pull-up device and second pull-up device;
a plurality of nodes; and
a set-reset latch comprising a first gate and a second gate;
wherein the first device is coupled to the first pull-up device by a first one of the plurality of nodes;
wherein the second device is coupled to the first gate by a third one of the plurality of nodes;
wherein the third device is coupled to the second pull-up device by a second one of the plurality of nodes;
wherein the fourth device is coupled to the second gate by a fourth one of the plurality of nodes; and
wherein the third node is an output of the first gate.

14. A level shifter circuit, comprising:
a serially coupled first device and second device;
a serially coupled third device and fourth device;
a coupled first pull-up device and second pull-up device;
a plurality of nodes; and
a set-reset latch comprising a first gate and a second gate;
wherein the first device is coupled to the first pull-up device by a first one of the plurality of nodes;
wherein the second device is coupled to the first gate by a third one of the plurality of nodes;
wherein the third device is coupled to the second pull-up device by a second one of the plurality of nodes;
wherein the fourth device is coupled to the second gate by a fourth one of the plurality of nodes; and
wherein the fourth node is an output of the second gate.

15. A level shifter circuit, comprising:
a complementary logic input adapted to receive a digital signal;
a first pull-up device;
a first node;
a first voltage;
wherein the first pull-up device is coupled to the first node and to the first voltage;
a second pull-up device;
a second node;
wherein the second pull-up device is coupled to the second node and to the first voltage;
wherein the first node and the second node are adapted to receive the digital signal;
a set-reset latch;
a third node;
a fourth node;
a first transistor coupled to the complementary logic input and to the first node;
a second transistor coupled to the first transistor and to the third node;
a third transistor coupled to the second node and to the complementary logic input;
a fourth transistor coupled to the third transistor;
wherein the first node and the second node are adapted to provide inputs to the set-reset latch;
wherein the third node and the fourth node are adapted to provide outputs from the set-reset latch; and
a logic output adapted to output the digital signal;
wherein the output terminal is adapted to receive the digital signal from the fourth node.

16. The level shifter circuit of claim 15 further comprising a first inverter, wherein the first inverter provides the complementary logic input.

17. The level shifter circuit of claim 16 further comprising a second voltage coupled to the first inverter.

18. The level shifter circuit of claim 16 further comprising a third voltage coupled to the first inverter.

19. The level shifter circuit of claim 15 further comprising a third voltage coupled to the second transistor.

20. The level shifter circuit of claim 15 further comprising a first speed-up transistor coupled to the first node, the third node, and to the first voltage.

21. The level shifter circuit of claim 15 further comprising a second speed-up transistor coupled to the second node, the fourth node, and to the first voltage.

22. The level shifter circuit of claim 15 further comprising a third voltage coupled to the fourth transistor.

23. The level shifter circuit of claim 15 further comprising a tie-off circuit coupled to the first voltage, the first pull-up transistor and to the second pull-up transistor.

24. The level shifter circuit of claim 23 further comprising a third voltage coupled to the tie-off circuit.

25. The level shifter circuit of claim 15 further comprising an inverter coupled to the fourth node and to the output terminal.

26. The level shifter circuit of claim 15, wherein the first pull-up device and the second pull-up device may be at least one of a following device selected from a group consisting of:
a pull-up device;
a transistor; and
a resistor.

27. The level shifter circuit of claim 15, wherein the first pull-up device and the second pull-up device are always on.

* * * * *